US012750056B2

(12) United States Patent
Gérardière et al.

(10) Patent No.: US 12,750,056 B2
(45) Date of Patent: Sep. 29, 2026

(54) SENSOR FOR CONTROLLING ACCESS TO A MOTOR VEHICLE, HAVING AN ELECTRODE SURROUNDED BY AN ANTENNA

(71) Applicant: Vitesco Technologies GmbH, Regensburg (DE)

(72) Inventors: Olivier Gérardière, Toulouse (FR); Maxime Rateau, Toulouse (FR); Yannis Escalante, Toulouse (FR)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 302 days.

(21) Appl. No.: 18/688,880

(22) PCT Filed: Sep. 6, 2022

(86) PCT No.: PCT/EP2022/074677
§ 371 (c)(1),
(2) Date: Mar. 4, 2024

(87) PCT Pub. No.: WO2023/041366
PCT Pub. Date: Mar. 23, 2023

(65) Prior Publication Data
US 2024/0413525 A1 Dec. 12, 2024

(30) Foreign Application Priority Data
Sep. 16, 2021 (FR) ....................................... 2109739

(51) Int. Cl.
*H03K 17/96* (2006.01)
*G07C 9/00* (2020.01)
(Continued)

(52) U.S. Cl.
CPC ....... *H03K 17/962* (2013.01); *G07C 9/00714* (2013.01); *G07C 9/00944* (2013.01);
(Continued)

(58) Field of Classification Search
CPC .............. H01Q 1/3241; G07C 9/00944; G07C 9/00714; G07C 9/00309; G07C 2209/64;
(Continued)

(56) References Cited

U.S. PATENT DOCUMENTS 7,679,571 B2 3/2010 Inaba et al.
10,511,347 B2 12/2019 Hueber et al.
(Continued)

FOREIGN PATENT DOCUMENTS

DE 102013102701 A1 9/2014
DE 102018106771 A1 10/2018
(Continued)

OTHER PUBLICATIONS

International Search Report (PCT/ISA/210) with English translation and Written Opinion (PCT/ISA/237) mailed on Nov. 30, 2022, by the European Patent Office as the International Searching Authority for International Application No. PCT/EP2022/074677 (16 Pages).

*Primary Examiner* — Amy He
(74) *Attorney, Agent, or Firm* — Buchanan Ingersoll & Rooney PC

(57) ABSTRACT

A device for a vehicle access control system, includes: a main electrode for carrying out a capacitive-type approach detection; and a transmitting and receiving antenna which is formed by a coil and is configured to transmit and receive a radiofrequency signal in order to identify a user. One turn of the coil includes: a first portion which delimits a region inside of which the main electrode is located; a second portion is offset relative to the main electrode, and at least one notch extends along one edge of the main electrode and connects the first portion and the second portion together. Each notch including two sections which are parallel to one another and connected together by a portion of the turn located at the bottom of the notch. It is thus possible to
(Continued)

obtain a large antenna, which at the same time effectively performs a guard ring function for the main electrode.

18 Claims, 7 Drawing Sheets

(51) Int. Cl.
*H01Q 1/32* (2006.01)
*H03K 17/955* (2006.01)

(52) U.S. Cl.
CPC ......... *H01Q 1/3241* (2013.01); *H03K 17/955* (2013.01); *G07C 9/00309* (2013.01); *G07C 2209/64* (2013.01); *G07C 2209/65* (2013.01); *H03K 2217/94089* (2013.01); *H03K 2217/960755* (2013.01)

(58) Field of Classification Search
CPC ............. G07C 2209/65; H03K 17/955; H03K 17/962; H03K 2217/94089; H03K 2217/960755
See application file for complete search history.

(56) References Cited

U.S. PATENT DOCUMENTS

| | | | |
|---|---|---|---|
| 11,269,108 B2 | 3/2022 | Sieg | |
| 2018/0367138 A1* | 12/2018 | Bennett | G01D 5/24 |
| 2019/0181918 A1 | 6/2019 | Pagani | |
| 2021/0072046 A1 | 3/2021 | Van Gastel et al. | |
| 2021/0173113 A1 | 6/2021 | Sieg | |

FOREIGN PATENT DOCUMENTS

| | | | | |
|---|---|---|---|---|
| DE | 102018122254 B3 | 12/2019 | | |
| EP | 1795860 A1 | 6/2007 | | |
| EP | 3484059 A2 | 5/2019 | | |
| FR | 3055347 A1 | 3/2018 | | |
| WO | WO-2020052923 A1 * | 3/2020 | | H03K 17/962 |

* cited by examiner

SENSOR FOR CONTROLLING ACCESS TO A MOTOR VEHICLE, HAVING AN ELECTRODE SURROUNDED BY AN ANTENNA

CROSS REFERENCE TO RELATED APPLICATIONS

This application is the U.S. National Phase Application of PCT International Application No. PCT/EP2022/074677, filed Sep. 6, 2022, which claims priority to French Patent Application No. 2109739, filed Sep. 16, 2021, the contents of such applications being incorporated by reference herein.

FIELD OF THE INVENTION

The invention relates to the automotive field and more particularly to the field of vehicle access sensors, enabling the automatic opening and/or closing of an opening such as a door. More particularly, the invention relates to a sensor for controlling access to a motor vehicle, with an electrode surrounded by an antenna.

BACKGROUND OF THE INVENTION

Capacitive-type presence sensors are known in the prior art for detecting the approach or distancing of a user, so as to anticipate the locking or unlocking of a motor vehicle door.

Such sensors are based on the use of a so-called main electrode, which forms a capacitor with the user's hand. The distance between the user's hand and the main electrode defines the capacitance of the capacitor. The main electrode is preferably integrated into the motor vehicle door, for example at the handle. In this way, capacitance measurements can detect when the user's hand is approaching or moving away from the handle.

In a known way, such a presence sensor can further comprise an electrically conductive guard ring surrounding the main electrode without direct physical contact with the latter. By bringing the guard ring to a predetermined potential, for example the same potential as the main electrode, electric field lines are guided to focus on the main electrode. This improves the sensitivity of the distance measurement based on a capacitance measurement.

Also known in the prior art are user recognition systems based on radiofrequency communication between a device on board the motor vehicle and a device worn by the user. The on-board device forms an interrogation and recognition device. The device carried by the user forms an identification device. In operation, the on-board device emits an interrogation signal. The interrogation signal is received by the device carried by the user, which in response sends back an identification signal incorporating user identification information. The identification signal is received by the on-board device. The user identification information can then be used within on-board systems on the motor vehicle, in particular to authorize or deny access to said vehicle.

The device carried by the user may comprise a simple RFID tag. Preferably, it is a smart phone, featuring a radiofrequency antenna and storing identification data. The on-board device includes, in particular, a radiofrequency antenna.

Advantageously, a capacitive-type presence sensor and a user recognition system cooperate together to detect the approach of an individual, and identify the approaching individual in order to control an automatic opening of a vehicle door when the approaching individual is authorized to access the vehicle. In this case, the motor vehicle receives both the capacitive presence sensor and part of the user recognition system.

In patent application DE 10 2018 122 254 B3, incorporated herein by reference, a system combining a capacitive-type presence sensor and a radiofrequency antenna of a user recognition system is described. In this document, the main electrode of the capacitive sensor has a comb shape. It is surrounded by the radiofrequency antenna, so that the metal surface of the radiofrequency antenna can form a guard electrode. The radiofrequency antenna is formed of concentric rectangular turns.

SUMMARY OF THE INVENTION

An aspect of the present invention is a device for a vehicle access control system, intended to be housed on board a motor vehicle to carry out a detection of a user's approach as well as recognition of said user, and having improved performance relative to the prior art.

An aspect of the present invention is a device for a vehicle access control system, intended to be housed on board a motor vehicle to carry out a user approach detection as well as recognition of said user, and comprising:

- a so-called main electrode, intended to form a capacitor with a user for carrying out a capacitive-type approach detection; and
- a transmitting and receiving antenna which is formed by a coil having a plurality of turns and is configured to transmit and receive a radiofrequency signal in order to identify a user;

wherein the main electrode is surrounded by one turn of the coil, referred to as the guard turn.

According to an aspect of the invention, the guard turn comprises:

- a first portion which delimits a region inside of which the main electrode is located,
- a second portion which is offset relative to the main electrode, and
- at least one notch which extends along one edge of the main electrode and connects the first portion and the second portion together, each notch comprising two sections which are parallel to one another and are connected together by a portion of the turn located at the bottom of the notch.

According to an aspect of the invention, all coil turns have substantially the same shape, defined by two portions separated in pairs by at least one notch. Preferably, each turn delimits a predetermined surface, in a plane parallel to the plane of the main electrode. For each pair of two turns on the coil, a mutual overlap rate between the corresponding predetermined surfaces may be greater than or equal to 90%, or even greater than or equal to 95%.

The radiofrequency signals that the antenna is able to transmit and receive have a carrier center frequency of between 3 kHz and 300 GHz. Preferably, the carrier center frequency is between 13 MHz and 14 MHZ, in particular 13.56 MHz. Particularly advantageously, said radiofrequency signals comply with the NFC (Near Field Communication) communication protocol, characterized in particular by a carrier centered on 13.56 MHz.

As in the prior art mentioned in the introduction, the coil of the transmitting and receiving antenna is suitable for forming at least part of a guard ring for the main electrode. The definition of a guard ring is given in the introduction. Throughout the text, the term "guard turn" refers to a turn arranged coplanar with the main electrode. Indeed, it is the latter that makes the greatest contribution to guiding electric field lines to focus them on the main electrode. However, it should be noted that the coil is made in a single piece, so that its other turns also provide such guidance (albeit to a lesser extent). In any case, an aspect of the invention makes it possible to arrange the coils one above the other, with only one of the coils coplanar with the main electrode. This improves the compactness of the device according to an aspect of the invention.

In an aspect of the invention, the guard turn may form only part of a guard ring, with the main electrode surrounded over only part of its circumference, preferably over at least 80% of its circumference.

Furthermore, in an aspect of the invention, the guard turn comprises a first portion, delimiting a region within which the main electrode is located, and a second portion, offset relative to the main electrode. The term offset means "not surrounding the main electrode", or "surrounding a surface distinct from the surface receiving the main electrode". In this way, only part of the guard turn serves as a guard ring for the main electrode. The guard turn can then be much larger than the main electrode. This ensures optimum performance of the transmitting and receiving antenna, while maintaining a guard ring function, and despite the smaller dimensions of the main electrode.

Thanks to the at least one notch according to an aspect of the invention, the first portion of the guard turn can extend close to the main electrode over almost the entire circumference of said main electrode. This makes it possible to optimize the guard ring function provided by the coil.

The two parallel sections correspond to two sections of two respective lines. Said lines are, for example, two parallel straight lines, or two parallel curved lines, or two parallel broken lines. In particular, the two parallel sections can be two straight segments, corresponding to two sections of two respective straight lines. In a variant, the two parallel sections can be two sections of two respective curved lines, for example two parallel circle arcs. According to another variant, the two parallel sections can be two sections of two respective broken lines, made up together of parallel segment pairs. In any case, the two parallel sections can be superimposed by a simple translational movement (without rotation), and advantageously have the same dimensions.

The notch comprises the two sections parallel to one another, connected together by a portion of turn located at the bottom of the notch. Preferably, the notch consists entirely of said sections and the turn portion at the bottom of the notch. During operation, an electric current flows through the guard turn. The current flowing in one of said sections flows in the opposite direction to the current flowing in the other of said sections. As these two electric currents flow in opposite directions, the respective magnetic fields they are likely to generate cancel one another out. This ensures that the notch does not generate parasitic magnetic fields that could impair the performance of the transmitting and receiving antenna.

Preferably, the notch extends along an edge of the main electrode, with sections of the notch extending parallel to the edge of the main electrode. In a particularly advantageous case, said sections are rectilinear, and the notch extends along a rectilinear edge of the main electrode, with the rectilinear sections of the notch extending parallel to the rectilinear edge of the main electrode.

Advantageously, the notch extends along an edge of the main electrode, with sections of the notch running parallel to the edge of the main electrode.

Preferably, the guard turn comprises two notches which have their respective sections aligned in pairs, and which have their respective notch bottoms facing one another.

The two notches can be symmetrical to one another, relative to a plane of symmetry passing between the two notch bottoms.

Preferably, the guard turn follows the shape of the main electrode along the entire circumference of said main electrode, except in a zone of said circumference located opposite the region between the two notch bottoms.

A distance between the two notch bottoms is advantageously less than or equal to 20% of the smallest width of the main electrode.

Preferably, the main electrode has the shape of a square or solid rectangle.

The device according to an aspect of the invention may further comprise a second electrode, intended to form a capacitor with a user for implementing capacitive-type distance detection, and located inside a surface delimited by the second portion of the guard turn.

Said second electrode can be located in the same plane as the main electrode, and therefore in the same plane as the so-called "guard turn". In operation, said guard turn is the turn that contributes most strongly to guiding electric field lines to focus them on the main electrode, and to guiding electric field lines to focus them on said second electrode.

In a variant, said second electrode can be located in a plane parallel to the plane of the main electrode. The second electrode is then located in a surface delimited by the orthogonal projection of the second portion of the guard turn, in the plane of the second electrode. Since all the turns have substantially the same shape, the second electrode is then located in a surface delimited by one turn of the coil, situated in the plane of the second electrode and thus forming a second guard turn. In operation, the turn referred to as the "guard turn" is the one that contributes most strongly to guiding the electric field lines so as to focus them on the main electrode, while said second guard turn is the one that contributes most strongly to guiding the electric field lines so as to focus them on said second electrode.

In an advantageous embodiment:

- the transmitting and receiving antenna and the main electrode extend together on the same printed circuit;
- the printed circuit is able to extend in a plane called the printed circuit plane; and
- the transmitting and receiving antenna turns extend one above the other along an axis orthogonal to the plane of the printed circuit, with the guard turn and the main electrode lying together in the same plane.

Advantageously, the device according to an aspect of the invention comprises:

- a first assembly, comprising said main electrode, forming a first main electrode, and a first guard electrode superimposed on the first main electrode along an axis orthogonal to the plane of the printed circuit;
- a second assembly, comprising a second main electrode, as well as a second guard electrode superimposed on the second main electrode along an axis orthogonal to the plane of the printed circuit;

and wherein:

- the first main electrode and the second guard electrode are arranged coplanar on the same top layer of the printed circuit;
- the second main electrode and the first guard electrode are arranged coplanar on the same lower layer of the printed circuit, distinct from said upper layer of the printed circuit;

the guard turn forms a first guard turn, surrounding the first main electrode and the second guard electrode, with the at least one notch which extends between the first main electrode and the second guard electrode; and the transmitting and receiving antenna coil further comprises a second guard turn, surrounding the second main electrode and the first guard electrode, with at least one notch of said second guard turn which extends between the second main electrode and the first guard electrode.

Preferably, said device comprises:

a first assembly, comprising said main electrode, forming a first main electrode, and a first guard electrode superimposed on the first main electrode along an axis orthogonal to the plane of the printed circuit;

a second assembly, comprising a second main electrode, as well as a second guard electrode superimposed on the second main electrode along an axis orthogonal to the plane of the printed circuit;

and wherein:

the first main electrode and the second main electrode are arranged coplanar on the same top layer of the printed circuit;

the first guard electrode and the second guard electrode are arranged coplanar on the same lower layer of the printed circuit, distinct from said upper layer of the printed circuit;

the guard turn forms a first guard turn, surrounding the first main electrode and the second main electrode, with the at least one notch which extends between the first main electrode and the second main electrode; and the transmitting and receiving antenna coil further comprises a second guard turn, surrounding the first guard electrode and the second guard electrode, with at least one notch of said second guard turn which extends between the first guard electrode and the second guard electrode.

An aspect of the invention also covers a system comprising:

a device according to an aspect of the invention;

a control circuit, electrically connected to both ends of the coil of said device in order to control the transmission and reception of the radiofrequency signal; and a capacitance-measuring circuit, electrically connected to the first electrode and to the guard turn of said device, the connection to the guard turn being made at a connection point located halfway along the coil, considering the unwound length of said coil.

BRIEF DESCRIPTION OF THE DRAWINGS

Other features and advantages of aspects of the invention will become more apparent upon reading the following description. This description is purely illustrative and should be read with reference to the appended drawings, in which.

DETAILED DESCRIPTION OF AT LEAST ONE EMBODIMENT

Figure 1A:
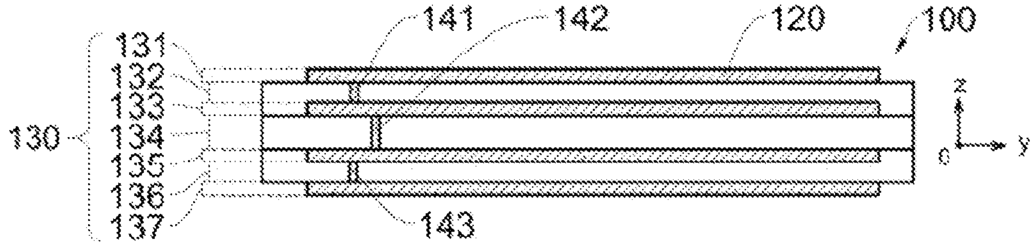
FIGS. 1A-1E illustrate a first embodiment of a device according to the invention, respectively from a side view and from different cross-sectional views.

For reasons of clarity, an orthonormal frame of reference (Oxyz) has been shown in these figures.

A description will now be given, with reference to FIGS. 1A to 1E, of a device 100 according to a first embodiment of the invention.

The device 100 is intended to be housed on board a motor vehicle. It is intended to form, with ancillary components not shown, a system for controlling access to said vehicle.

The device 100 comprises a main electrode 110 and a transmitting and receiving antenna 120, integrated together on a single printed circuit 130, here a multilayer printed circuit.

The printed circuit 130 comprises at least one current-carrying layer and at least one electrically insulating layer. Advantageously, it is formed of at least two current-carrying layers, separated in pairs by a respective electrically insulating layer. Each current-carrying layer comprises tracks of electrically conductive material.

The layers which together form the printed circuit 130 extend parallel to the plane (Oxy), superimposed on one another along an axis (Oz) orthogonal to the plane (Oxy). A plane parallel to the plane (Oxy) and passing through the center of the 130 printed circuit is defined as the “printed circuit plane”. The printed circuit 130 may be rigid and planar, extending along said printed circuit plane. In a variant, the printed circuit 130 may be flexible, and able to extend along said printed circuit plane. In any case, the printed circuit 130 is able to extend in a plane (Oxy), with the axis of its thickness oriented along the axis (Oz).

In the example shown in FIGS. 1A to 1E, the printed circuit 130 consists of four current-carrying layers 131, 133, 135, 137, separated in pairs by an electrically insulating layer 132, 134, 136. Given their arrangement along the axis (Oz), the layer 131 can be considered to form an upper layer of the printed circuit, and the layer 137 can be considered to form a lower layer of the printed circuit. Preferably, but by no means restrictively, said layers 131 and 137 form two outer layers of the printed circuit.

Each electrically insulating layer 132, 134, 136 is traversed by at least one respective via 141, 142, 143. In FIG. 1A, the device 100 is shown in cross-section in a plane (Oyz) passing through the vias 141, 142, 143. In variants not shown, the vias 141, 142, 143 are not all located in the same plane.

In FIGS. 1B to 1E, the device 100 is shown in respective cross-sectional views, in planes (Oxy) passing through the first, second, third and fourth current-carrying layers 131, 133, 135, 137 respectively.

Figure 1B:
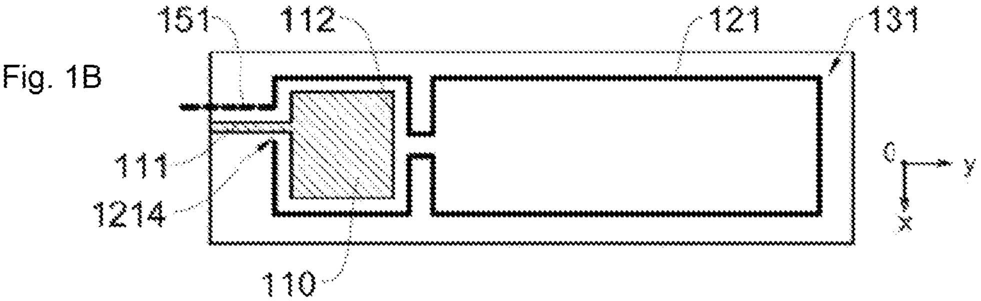

Here, the main electrode 110 extends into the layer 131 of the printed circuit (see FIG. 1B). The main electrode 110 is made of an electrically conductive material such as copper. It is inscribed inside a square or rectangular surface, here a square surface. Here, it has a solid shape, filling the entire square or rectangular surface.

An aspect of the invention is not limited to this shape of the main electrode 110 and covers numerous variants with any shape of the main electrode 110, for example a shape defined by a succession of teeth located on one or both sides of a main segment (or central axis), or any solid shape without concavity.

The main electrode 110 is configured to form a capacitor with a user's hand for carrying out a capacitive-type approach detection. The main electrode 110 is adapted to be electrically connected to a capacitance measurement circuit, not shown, and appended to the device according to an aspect of the invention. FIG. 1B also shows a portion 111 of an electrical connection line linking the main electrode 110 to the capacitance measurement circuit.

The transmitting and receiving antenna 120 is formed of a coil, which here comprises four turns 121, 123, 125, 127 and vias 141, 142, 143. Each of the turns 121, 123, 125, 127 extends into a respective one of the current-carrying layers 131, 133, 135, 137. The directly adjacent turns are connected in pairs by the vias 141, 142, 143 respectively, passing through the one electrical insulation layer in the thickness direction (Oz).

The transmitting and receiving antenna 120 is made of an electrically conductive material such as copper. It is configured to send and receive radiofrequency signals, the carrier centre frequency of which is between 3 kHz and 300 GHz, preferably between 13 MHz and 14 MHz, and more particularly equal to 13.56 MHZ. Particularly advantageously, the transmitting and receiving antenna 120 is configured to send and receive radiofrequency signals that comply with the NFC communication protocol.

The transmitting and receiving antenna 120 is configured to carry out user recognition, based on information exchanges between a device on board the vehicle and a device worn by a user. In use, the transmitting and receiving antenna 120 sends an interrogation signal to the device carried by the user, and receives in return an identification signal returned by the device carried by the user. In practice, the identification signal may correspond to the interrogation signal back-modulated by the device worn by the user with impedance modification.

The various turns 121, 123, 125, 127 all have substantially the same shape (particularly near the vias).

Figure 2:
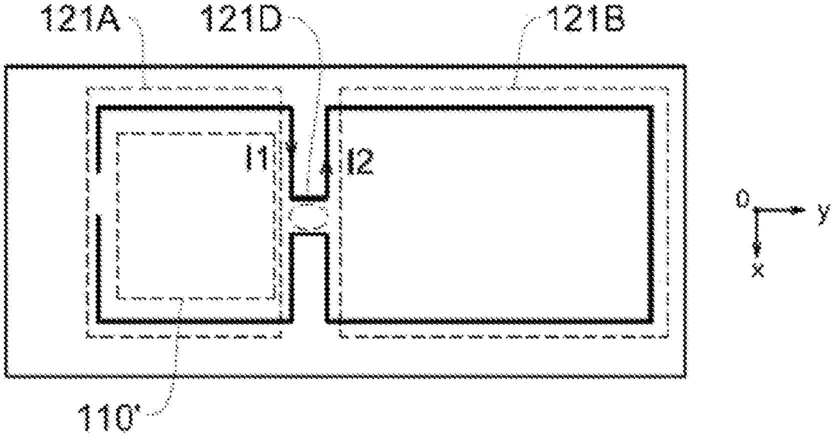
FIG. 2 shows the guard turn of the device from FIGS. 1A to 1E.
Figure 3:
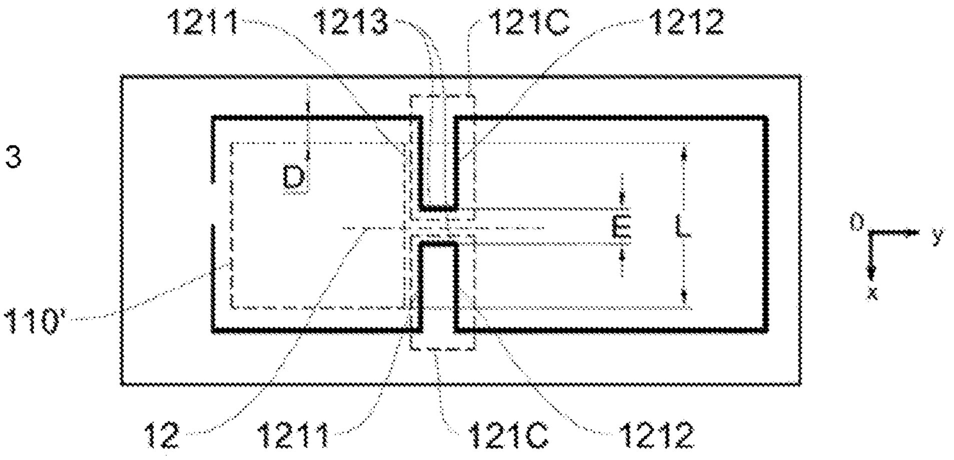
FIG. 3 shows the guard turn of the device from FIGS. 1A to 1E, and shows features related to its dimensions.

With particular reference to FIGS. 2 and 3, the shape of the turn 121 extending coplanar with the main electrode 110 is described. In particular, each of FIGS. 2 and 3 shows the turn 121, and in dotted lines the location 110' of the main electrode, in a cross-sectional view in a plane (Oxy).

According to an aspect of the invention, the turn 121 is constituted by (see FIGS. 2 and 3):

- a first portion 121A which delimits a region inside of which the main electrode 110 is located (the location 110' of which is shown by dashes in FIG. 2);
- a second portion 121B which is offset relative to the main electrode 110, not surrounding the latter; and
- at least one notch 121C, in each case extending along an edge 112 of the main electrode (see FIG. 1B) and connecting the first portion 121A to the second portion 121B.

Each notch 121C is formed here by two sections 1211, 1212, or segments, parallel to one another, and connected together by a coil portion 1213 defining a bottom of the notch.

The sections 1211 and 1212 both have the same dimensions. In the example shown in the figures, but not restrictively, the sections 1211 and 1212 are straight. One section 1211 runs along the edge 112 of the main electrode 110.

Thanks in particular to the first portion 121A, the turn 121 is able to form at least part of a guard ring for the main electrode 110. The turn 121 is therefore referred to as a "guard turn". In operation, the turns of the coil, and thus in particular the guard turn 121, are brought to a predetermined electrical potential, for example the same potential as the main electrode. The turns of the coil, and more particularly the turn 121, thus guide the field lines to focus them on the main electrode 110.

The turn 121 further comprises the second portion 121B, which has no (or little) influence on the guard ring function of the turn. The presence of this second portion 121B increases the total extent of the turn 121. However, large turn dimensions enable the coil to perform well as a transmitting and receiving antenna.

The notches 121C between the first portion 121A and the second portion 121B of the turn 121 allow the shape of the turn 121 to better follow the shape of the main electrode, despite a turn of large dimensions. This makes it possible to optimize both the guard ring function and the radiofrequency transmission and reception function.

Preferably, the distance D between the turn 121 and the nearest edge of the main electrode 110 (see FIG. 3) remains less than or equal to a threshold value, over at least 80% of the circumference of said main electrode 110, or even at least 90% of the circumference of the latter. Preferably, the distance D remains less than or equal to the threshold value, over the entire circumference of the main electrode located opposite the first portion 121A of the turn, and opposite the section 1211 of each notch 121C. Said threshold value is, for example, 20% of the length L of the shortest side of the main electrode 110 (see FIG. 3), or even 10% of this length L, or even 5% of this length L.

In addition, the design of the notch 121C with the two sections 1211, 1212 parallel to one another makes it possible to limit a parasitic magnetic field likely to interfere with the detection performance of the transmitting and receiving antenna 120. In operation, the current flowing in the turn 121 comprises, in effect:

- a current I1, which propagates in the section 1211 in a positive direction oriented along the axis (Ox), and
- a current I2, which propagates in the section 1212 oriented along the same axis (Ox) but in the opposite direction, in this case a negative direction.

The currents I1 and I2 will generate respective magnetic fields which will cancel one another out, thus making it possible to limit the parasitic magnetic fields generated by the notch 121C.

Here, but in a non-limiting manner, the first portion 121A comprises two sections parallel to one another, connected together by a third section to form three sides of a square or rectangle. Similarly, the second portion 121B comprises two sections parallel to one another, connected together by a third section to form three sides of a square or rectangle. Here, and advantageously, the two parallel sections of the first portion 121A are axially aligned, in pairs, with the two parallel sections of the second portion 121B.

Here, but in a non-limiting manner, in each notch 121C the two sections 1211, 1212 extend parallel to the axis (Ox), and parallel to the edge 112 of the main electrode 110. The sections 1211, 1212 are connected together by the turn portion 1213, which here extends along axis (Oy) orthogonal to the sections 1211, 1212. In variants not shown, the turn portion 1213 may have another shape, for example a curved shape. In variants not shown, the sections 1211, 1212 are inclined relative to the edge of main electrode 110 along which they extend. The angle of inclination is preferably less than or equal to 15%.

Here, the two sections 1211 and 1212 face one another. In other words, they each extend along a respective longitudinal axis, here parallel to the axis (Ox), with their respective ends aligned in pairs along a respective axis parallel to their longitudinal axes. Here, the ends of the sections 1211 and 1212 are aligned in pairs along two axes parallel to the axis (Oy).

Preferably, and as shown in the figures, the depth of the notch 121C (dimensions along the longitudinal axis of the sections 1211, 1212) is at least twice as great as its width (average distance between the two sections 1211, 1212), or even at least four times as great.

Here, but in a non-limiting manner, the turn 121 comprises two notches 121C located face to face with their respective notch bottoms 1213 located opposite one another.

Preferably, the distance D between the turn 121 and the nearest edge of the main electrode 110 (see FIG. 3) remains less than or equal to the above-mentioned threshold value, over the entire circumference of the main electrode 110 except in the zone of said circumference located opposite the region 121D between the two notch bottoms.

The distance E between the two notch bottoms 1213 is here less than or equal to 25% of the length L of the shortest side of the main electrode 110 (see FIG. 3), preferably less than or equal to 15% or even 10% of said length L. The distance E is measured in a plane (Oxy) parallel to the printed circuit plane. It is the smallest distance between one turn edge and the opposite turn edge.

In variants not shown, the turn 121 may comprise a single notch 121C between the first portion 121A and the second portion 121B.

Here, but in a non-limiting manner, the two notches 121C have their respective sections 1211, 1212 aligned in pairs along the same axis. In other words, the sections 1211 of the two notches 121C extend together along the same first straight line, and the sections 1212 of the two notches 121C extend together along the same, second straight line.

Here, but not restrictively, the two notches 121C are symmetrical to one another, relative to a plane of symmetry 12 passing between the two notches 121C. Here, the plane of symmetry 12 extends in a plane (Oyz) orthogonal to the plane of the printed circuit.

Figure 1C:
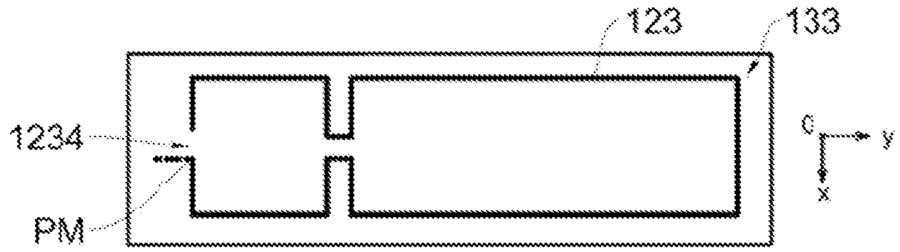
Figure 1D:
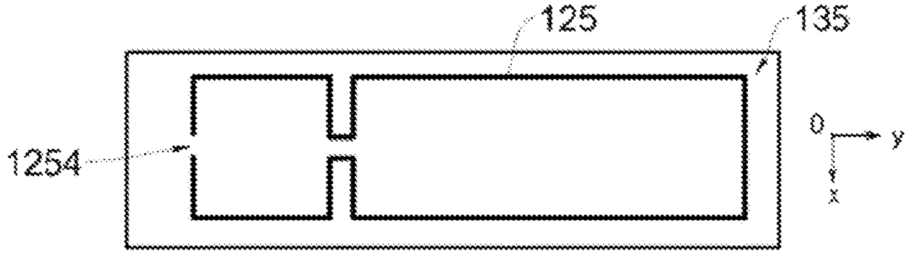
Figure 1E:
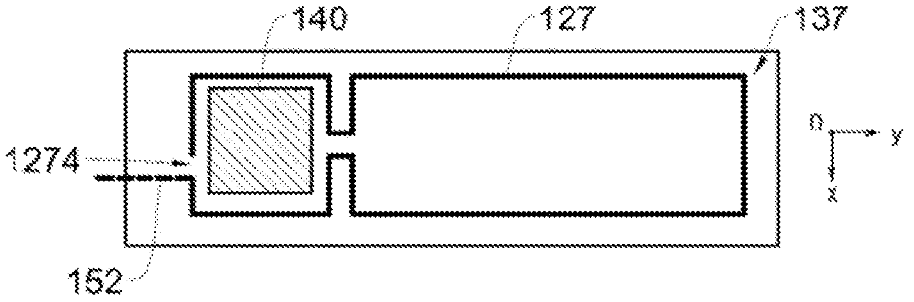

Next, with reference to FIGS. 1C to 1E, the current-carrying layers 133, 135 and 137 respectively are described.

FIG. 1C shows the second current-carrying layer 133. This layer 133 comprises the second turn 123 of the coil. The second turn 123 has a shape substantially similar to that of the guard turn, in particular with two portions separated in pairs by the at least one notch. The orthogonal projection of the guard turn 121, in the plane of the turn 123, corresponds here to the shape of the second turn 123, except for the positioning of a spacing 1214, respectively 1234, between a current entry point on the turn and a current exit point from the turn. The second turn 123 also contributes to guiding the field lines to focus them on the main electrode 110, albeit to a lesser extent since it is physically further away from said main electrode 110. The advantages and effects detailed above, and linked to the original shape of the turn 121, also apply to the second turn 123.

Similarly, FIG. 1D shows the third current-carrying layer 135. This layer 135 comprises the third turn 125 of the coil. The third turn 125 has a shape substantially similar to that of the guard turn, in particular with two portions separated in pairs by the at least one notch. The orthogonal projection of the guard turn 121, in the plane of the turn 125, corresponds here to the shape of the third turn 125, except for the positioning of a spacing 1214, respectively 1254, between a current entry point on the turn and a current exit point from the turn. The third turn 125 also contributes to guiding the field lines to focus them on the main electrode 110, albeit to a lesser extent since it is physically further away from said main electrode 110. The advantages and effects detailed above, and linked to the original shape of the turn 121, also apply to the third turn 125.

Similarly, FIG. 1E shows the fourth current-carrying layer 137. This layer 137 comprises the fourth and last turn 127 of the coil. The last turn 127 has a shape substantially similar to that of the guard turn, in particular with two portions separated in pairs by the at least one notch. The orthogonal projection of the guard turn 121, in the plane of the turn 127, corresponds here to the shape of the last turn 127, except for the positioning of a spacing 1214, respectively 1274, between a current entry point on the turn and a current exit point from the turn. The fourth turn 127 also contributes to guiding the field lines to focus them on the main electrode 110, albeit to a lesser extent since it is physically further away from said main electrode 110. The advantages and effects detailed above, and linked to the original shape of the turn 121, also apply to the fourth turn 127.

FIG. 1E also shows a guard electrode 140, located in the fourth current-carrying layer 137, opposite the main electrode 110. In operation, the guard electrode 140 is raised to a predetermined electrical potential (for example that of the main electrode 110), to further improve the focusing of electric field lines on the main electrode 110. Here, the guard electrode 140 is located inside the turn 127, with the same arrangement as that of the main electrode 110 relative to the guard turn 121.

In operation, the current flows successively through each of the turns 121, 123, 125 and 127, passing through one via 141, 142 or 143 to move from one turn to the next.

FIGS. 1B and 1E also show, in dashed lines, the electrically conductive lines 151, 152 through which the current enters and then leaves the coil formed by the turns and vias.

A description will now be given, with reference to FIGS. 4A to 4C, of a device 200 according to a second embodiment of the invention. This second embodiment will be described only in respect of its differences relative to the first embodiment.

Figure 4A:
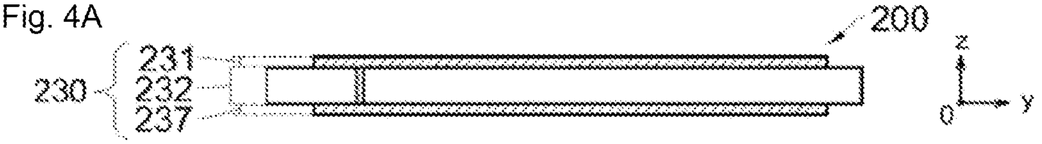
FIGS. 4A-4C illustrate a second embodiment of a device according to the invention, respectively from a side view and from different cross-sectional views.
Figure 4B:
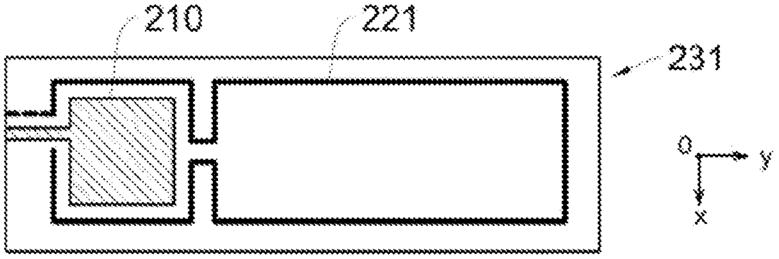
Figure 4C:
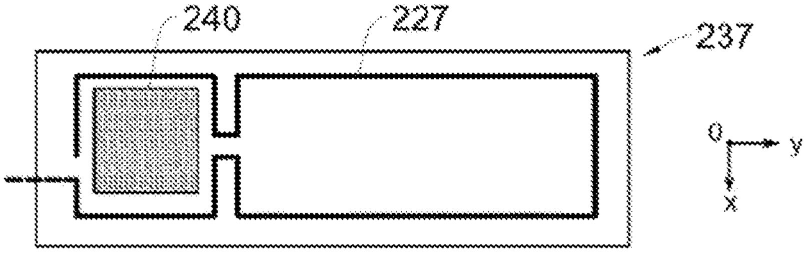

In this embodiment, the printed circuit 230 is formed of two current-carrying layers 231, 237, separated in pairs by an electrically insulating layer 232 (see FIG. 4A).

The layer 231 is identical to the layer 131 of the first embodiment of the invention, and comprises a guard turn 221 and a main electrode 210 as described above (see FIG. 4B).

The layer 237 is identical to the layer 137 of the first embodiment of the invention and has a final turn 227 and a guard electrode 240 as described above (see FIG. 4C).

The different variants mentioned above with regard to the first embodiment also apply to this second embodiment.

A description will now be given, with reference to FIGS. 5A to 5D, of a device according to a third embodiment of the invention. This third embodiment will be described only in respect of its differences from the first embodiment.

In this embodiment, the device comprises:

- a first assembly, comprising a first main electrode 310A and a first guard electrode 340A superimposed along the axis (Oz), said first assembly being dedicated to capacitive-type approach detection as described in the introduction; and a second assembly, comprising a second main electrode 310B and a second guard electrode 340B superimposed along the axis (Oz), said second assembly being dedicated to a capacitive-type distance detection. This type of distance detection is based on the same principles as approach detection, and makes it possible to detect a movement away from the user's hand with a view to controlling automatic locking of the motor vehicle opening.

In this embodiment, the first main electrode 310A and the second guard electrode 340B are formed coplanar in the first current-carrying layer 331. The first turn 321 of the coil forms a guard turn according to an aspect of the invention, for the first main electrode 310A. Here, the turn 321 surrounds both the first main electrode 310A and the second guard electrode 340B, with the notches of the turn 321 in between (see FIG. 5A).

Here, the first turn 321 has a planar symmetry, relative to a plane (Oxz) passing through the center of the two notches.

Similarly, the second main electrode 310B and the first guard electrode 340A are formed coplanar in the last current-carrying layer 337. The fourth (and last) turn 327 of the coil forms a guard turn according to an aspect of the invention for the second main electrode 310B. Here, the turn 327 surrounds both the second main electrode 310B and the first guard electrode 340A, with the notches of the turn 327 in between (see FIG. 5D).

Figure 5A:
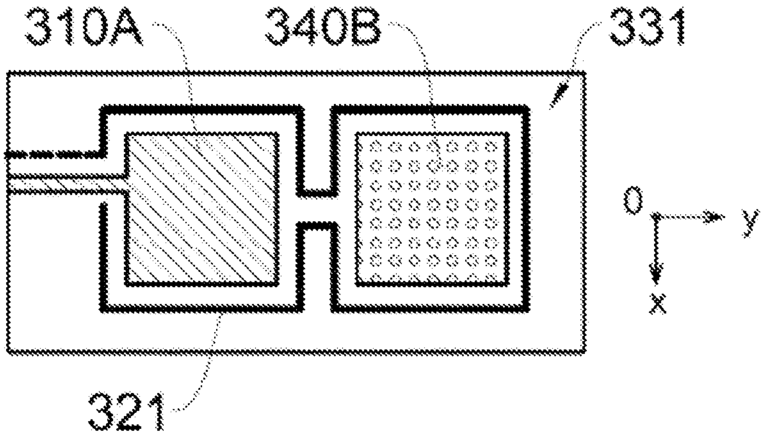
FIGS. 5A-5D illustrate a third embodiment of a device according to the invention, in different cross-sectional views.
Figure 5B:
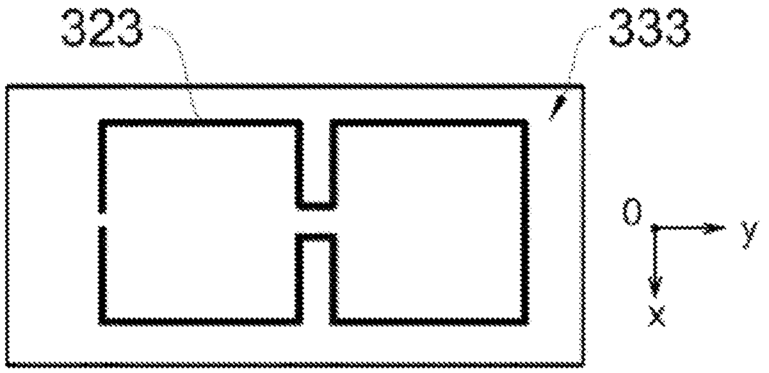
Figure 5C:
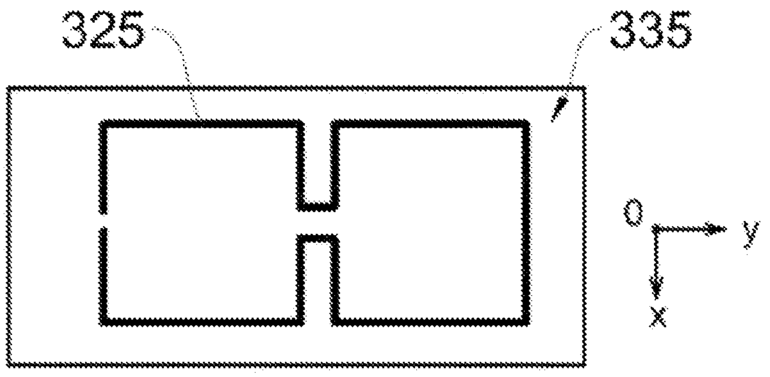
Figure 5D:
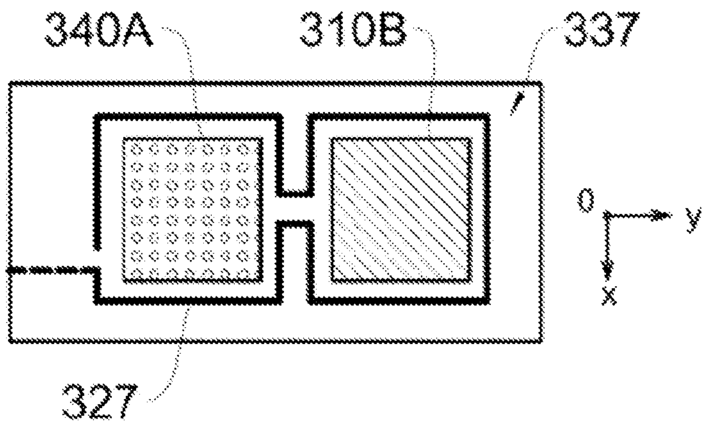

A second turn 323, respectively a third turn 325, of the coil extends from the second current-carrying layer 333 (see FIG. 5B), respectively third current-carrying layer 335 (see FIG. 5C).

As in the first embodiment, the orthogonal projection of the first turn 321 in the plane of the second, respectively third, respectively fourth current-carrying layer, corresponds to the shape of the second, respectively third, respectively fourth turn 323, 325, 327, except for the positioning, in each turn, of a spacing between a current entry point on the turn and a current exit point from the turn.

The different variants mentioned above with regard to the first embodiment also apply to this third embodiment.

A description will now be given, with reference to FIGS. 6A to 6D, of a device according to a fourth embodiment of the invention. This fourth embodiment will be described only in respect of its differences from the third embodiment.

Figure 6A:
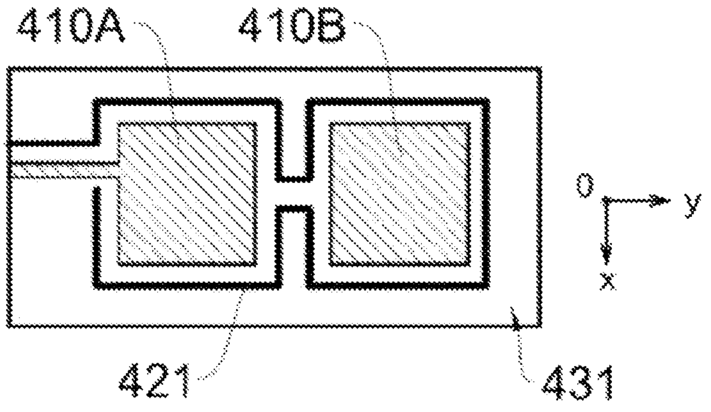
FIGS. 6A-6D illustrate a fourth embodiment of a device according to the invention, from different cross-sectional views.
Figure 6B:
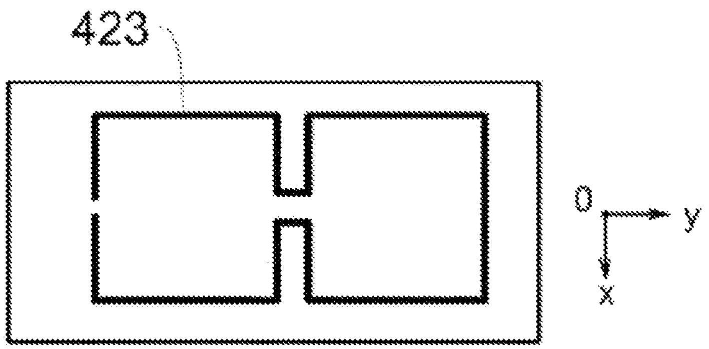
Figure 6C:
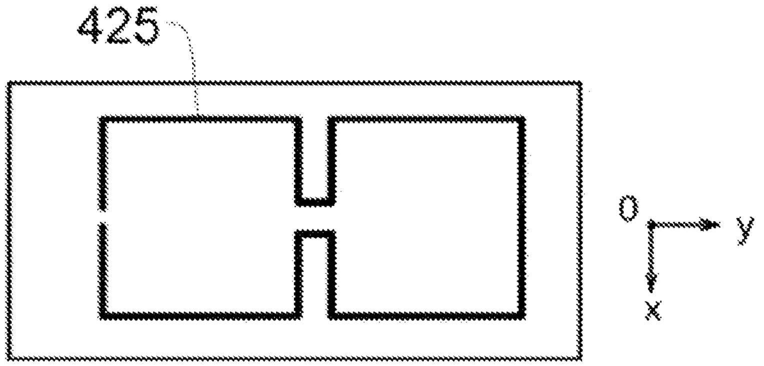
Figure 6D:
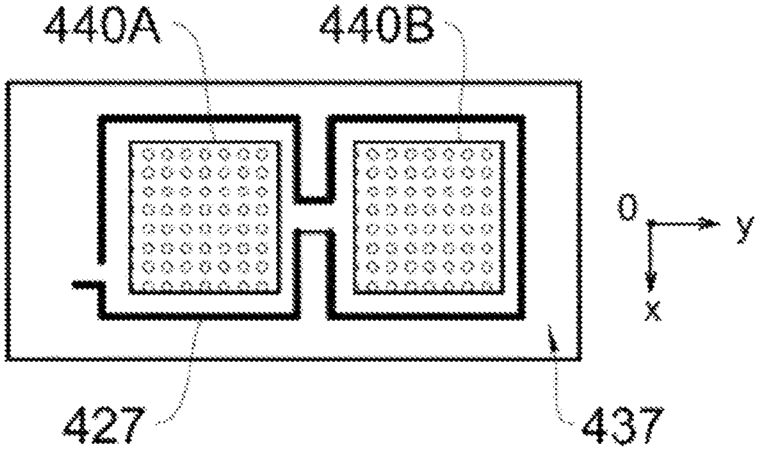

In this embodiment, the first main electrode 410A and the second main electrode 410B are formed coplanar in the first current-carrying layer 431 (see FIG. 6A). Here, the turn 421 surrounds both the first main electrode 410A and the second main electrode 410B, with the at least one notch of the turn 421 between the first main electrode 410A and the second main electrode 410B. The turn 421 forms a guard turn for both the first main electrode 410A and the second main electrode 410B.

Similarly, the first guard electrode 440A and the second guard electrode 440B are formed coplanar in the last current-carrying layer 437. The fourth (and last) turn 427 of the coil surrounds the first guard electrode 440A as well as the second guard electrode 440B, with the at least one notch in between. In a variant, not shown, the first guard electrode 440A and the second guard electrode 440B are formed together in one piece, by a metal surface passing between the two notches of the turn 437.

Again, the orthogonal projection of the first turn 421 in the plane of the second, respectively third, respectively fourth current-carrying layer, corresponds to the shape of the second, respectively third, respectively fourth turn 423, 425, 427, except for the positioning, in each turn, of a spacing between a current entry point on the turn and a current exit point from the turn.

The different variants mentioned above with regard to the first embodiment also apply to this third embodiment.

The third and fourth embodiments are particularly advantageous, in that they offer a particularly compact arrangement and improved magnetic insulation between a capacitive detection electrode used to control the unlocking of an opening and a capacitive detection electrode used to control the locking of an opening. In each of these two embodiments, each of the main electrode (then called a first main electrode and dedicated to an approach detection) and the second electrode (then called a second main electrode and dedicated to a distance detection), is located inside a surface delimited by the coils, and more particularly by the guard turn.

Figure 7:
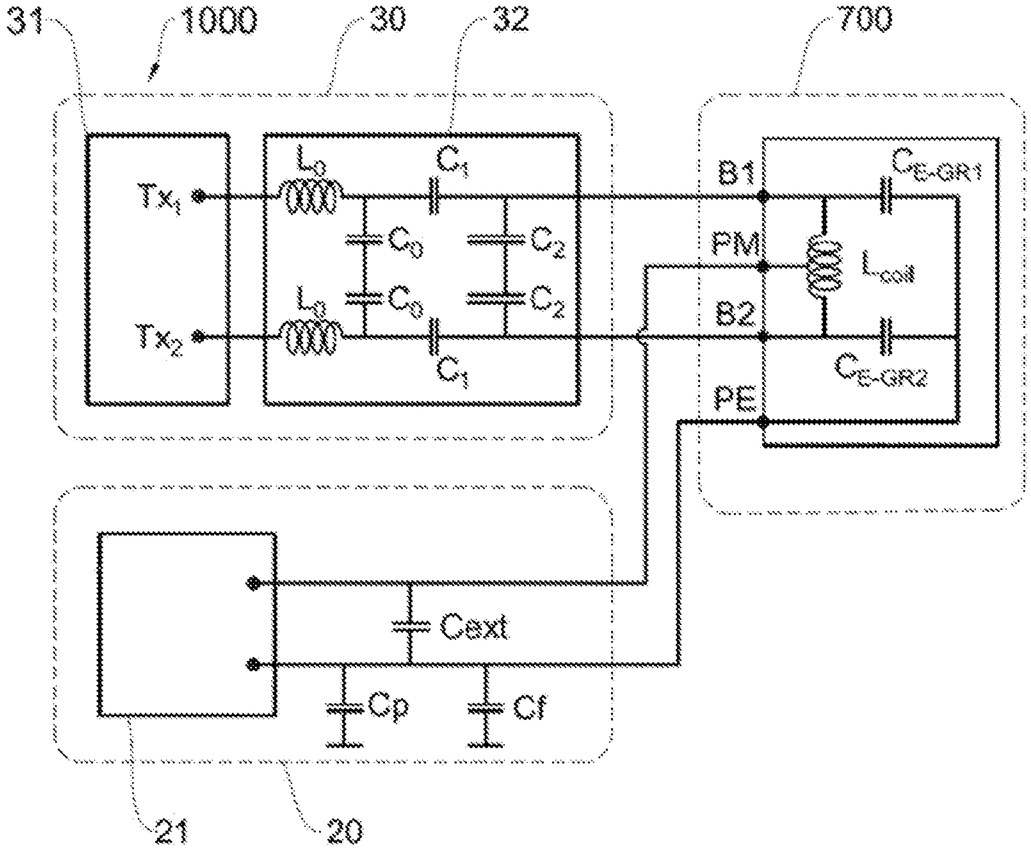
FIG. 7 schematically illustrates a system according to an aspect of the invention, comprising in particular a capacitance measurement circuit and a transmitting and receiving antenna control circuit.

Lastly, with reference to FIG. 7, a system 1000 according to an aspect of the invention is illustrated schematically, comprising a capacitance measurement circuit 20, a transmitting and receiving antenna control circuit 30, and a device 700 according to an aspect of the invention.

In FIG. 7, the device 700 is schematically represented by its equivalent circuit. $L_{coil}$ is the inductance of a coil corresponding to the coil forming a transmitting and receiving antenna. $C_{E\text{-}GR1}$ and $C_{E\text{-}GR2}$ are capacitances of which the sum corresponds to the capacitance of a capacitor formed by the main electrode of the device 700 according to an aspect of the invention and the transmitting and receiving antenna.

The capacitance measurement circuit 20 comprises a microcontroller 21 and a set of capacitors $C_{ext}$, $C_p$, $C_f$. It is configured to bring the main electrode and the guard ring to predetermined potentials, and to measure the capacitance of a capacitor formed by the main electrode of the device 700 according to an aspect of the invention and ground (the user's hand adding capacitance between the hand and ground).

The transmitting and receiving antenna control circuit 30, or NFC antenna control circuit, here comprises a transceiver 31 and a matching circuit 32, with the matching circuit 32 connected between the transceiver 31 and the device 700 according to an aspect of the invention. Matching circuit 32 is here composed of two arms. each arm is connected to a respective connection point $Tx_1$, $Tx_2$ of the transceiver 31, and each arm comprises an inductance $L_0$ and a capacitance $C_1$ connected in series. Both arms are connected by two lines formed respectively by two capacitances $C_0$ in series (between $C_0$ and $C_1$ of respective arms) and two capacitances $C_2$ in series (at the output of the matching circuit 32, on the side opposite to transceiver 31).

According to an aspect of the invention, the NFC antenna control circuit 30 is connected to the device 700 according to an aspect of the invention, at each of the two ends of the coil forming the transmitting and receiving antenna (points B1 and B2).

The capacitance measuring circuit 20 is connected to the device 700 according to an aspect of the invention, at the main electrode (PE point) and at the coil (PM point) forming both the transmitting and receiving antenna and the guard ring.

Here, and advantageously, the connection to the coil is made at a midpoint PM, located midway along the coil considering the length of the unwound coil (see also point PM in FIG. 1C). This arrangement ensures that the connection of the capacitance-measuring circuit 20 does not disturb the balancing of the matching circuit 32, and therefore does not interfere with the antenna function of the coil.

In addition, the inputs and outputs of the microcontroller 21 of the circuit 20 are high-impedance, which also helps to avoid any interference of the circuit 20 with the radiofrequency transmission and reception function of device 700 according to an aspect of the invention.

It is also shown that matching circuit 32 does not disturb the capacitive function of the device 700 according to an aspect of the invention (the matching circuit 32 adds a parasitic capacitance between the guard turn and ground, but this is not a problem because the potential of the coil including the guard turn is low-impedance, fixed by a voltage source).

In use, the capacitance-measuring circuit 20 and the NFC antenna control circuit 30 are synchronized together, to enable the coil to alternately perform the guard ring function, by being raised to a predetermined potential, and the transmission and reception antenna function.

The invention is not limited to the examples described above, and also includes many other variants with other shapes of the guard turn, with or without a guard electrode superimposed on the main electrode, with a different number of turns in the coil, with a different number of printed circuit layers, etc.

The invention claimed is:

1. A device for a vehicle access control system, intended to be housed on board a motor vehicle for carrying out an approach detection of a user as well as recognition of said user, and comprising:

a main electrode, intended to form a capacitor with a user for carrying out a capacitive-type approach detection; and a transmitting and receiving antenna which is formed by a coil comprising a plurality of turns which all have a similar shape and is configured to transmit and receive a radiofrequency signal in order to identify a user;

wherein the main electrode is surrounded by one turn of the coil, referred to as the guard turn;

the guard turn comprising:

a first portion which delimits a region inside of which the main electrode is located, a second portion which is laterally offset relative to the main electrode and the first portion, and at least one notch which extends along an edge of the main electrode and connects the first portion and the laterally offset second portion together, each notch comprising two sections which are parallel to one another and are connected together by a portion of the turn located at the bottom of the notch, and the other turns of the coil each have a shape substantially similar to that of the guard turn, each with two portions separated in pairs by at least one notch.

2. The device as claimed in claim 1, wherein the notch extends along an edge of the main electrode, with sections of the notch which extend parallel to the edge of the main electrode.

3. The device as claimed in claim 2, wherein the guard turn comprises two notches which have their respective sections aligned in pairs, and which have their respective notch bottoms facing one another.

4. The device as claimed in claim 1, wherein the guard turn comprises two notches which have their respective sections aligned in pairs, and which have their respective notch bottoms facing one another.

5. The device as claimed in claim 4, wherein the two notches are symmetrical to one another, relative to a plane of symmetry passing between the two notch bottoms.

6. The device as claimed in claim 5, wherein the guard turn follows the shape of the main electrode along the entire circumference of said main electrode, except in a zone of said circumference located opposite the region between the two notch bottoms.

7. The device as claimed in claim 5, wherein a distance between the two notch bottoms is less than or equal to 20% of the smallest width of the main electrode.

8. The device as claimed in claim 4, wherein the guard turn follows the shape of the main electrode along the entire circumference of said main electrode, except in a zone of said circumference located opposite the region between the two notch bottoms.

9. The device as claimed in claim 8, wherein a distance between the two notch bottoms is less than or equal to 20% of the smallest width of the main electrode.

10. The device as claimed in claim 4, wherein a distance between the two notch bottoms is less than or equal to 20% of the smallest width of the main electrode.

11. The device as claimed in claim 1, wherein the main electrode has the shape of a square or solid rectangle.

12. The device as claimed in claim 1, wherein:

the transmitting and receiving antenna and the main electrode extend together on the same printed circuit;

the printed circuit is able to extend in a plane called the printed circuit plane; and the turns of the transmitting and receiving antenna extend one above the other along an axis orthogonal to the plane of the printed circuit, with the guard turn and the main electrode lying together in the same plane.

13. The device as claimed in claim 1, further comprising a second electrode, intended to form a capacitor with a user for implementing capacitive-type distance detection, and located inside a surface delimited by the second portion of the guard turn.

14. A device for a vehicle access control system, intended to be housed on board a motor vehicle for carrying out an approach detection of a user as well as recognition of said user, and comprising:

a main electrode, intended to form a capacitor with a user for carrying out a capacitive-type approach detection; and a transmitting and receiving antenna which is formed by a coil comprising a plurality of turns which all have a similar shape and is configured to transmit and receive a radiofrequency signal in order to identify a user;

wherein the main electrode is surrounded by one turn of the coil, referred to as the guard turn;

the guard turn comprising:

a first portion which delimits a region inside of which the main electrode is located, a second portion which is offset relative to the main electrode, and at least one notch which extends along an edge of the main electrode and connects the first portion and the second portion together, each notch comprising two sections which are parallel to one another and are connected together by a portion of the turn located at the bottom of the notch, and the other turns of the coil each have a shape substantially similar to that of the guard turn, each with two portions separated in pairs by at least one notch;

a first assembly, comprising said main electrode, forming a first main electrode, and a first guard electrode superimposed on the first main electrode along an axis orthogonal to the plane of the printed circuit;

a second assembly, comprising a second electrode, called the second main electrode, as well as a second guard electrode superimposed on the second main electrode along an axis orthogonal to the plane of the printed circuit;

and wherein:

the first main electrode and the second guard electrode are arranged coplanar on the same top layer of the printed circuit;

the second main electrode and the first guard electrode are arranged coplanar on the same lower layer of the printed circuit, distinct from said upper layer of the printed circuit;

the guard turn surrounds the first main electrode and the second guard electrode, with the at least one notch which extends between the first main electrode and the second guard electrode; and the transmitting and receiving antenna coil further comprises a second turn, called a second guard turn, surrounding the second main electrode and the first guard electrode, with at least one notch of said second guard turn which extends between the second main electrode and the first guard electrode.

15. A device for a vehicle access control system, intended to be housed on board a motor vehicle for carrying out an approach detection of a user as well as recognition of said user, and comprising:

a main electrode, intended to form a capacitor with a user for carrying out a capacitive-type approach detection; and a transmitting and receiving antenna which is formed by a coil comprising a plurality of turns which all have a similar shape and is configured to transmit and receive a radiofrequency signal in order to identify a user;

wherein the main electrode is surrounded by one turn of the coil, referred to as the guard turn;

the guard turn comprising:

a first portion which delimits a region inside of which the main electrode is located, a second portion which is offset relative to the main electrode, and at least one notch which extends along an edge of the main electrode and connects the first portion and the second portion together, each notch comprising two sections which are parallel to one another and are connected together by a portion of the turn located at the bottom of the notch, and the other turns of the coil each have a shape substantially similar to that of the guard turn, each with two portions separated in pairs by at least one notch;

a first assembly, comprising said main electrode, forming a first main electrode, and a first guard electrode superimposed on the first main electrode along an axis orthogonal to the plane of the printed circuit;

a second assembly, comprising a second electrode, called the second main electrode, as well as a second guard electrode superimposed on the second main electrode along an axis orthogonal to the plane of the printed circuit;

and wherein:

the first main electrode and the second main electrode are arranged coplanar on the same top layer of the printed circuit;

the first guard electrode and the second guard electrode are arranged coplanar on the same lower layer of the printed circuit, distinct from said upper layer of the printed circuit;

the guard turn surrounds the first main electrode and the second main electrode, with the at least one notch which extends between the first main electrode and the second main electrode; and the transmitting and receiving antenna coil further comprises a second turn, called a second guard turn, surrounding the first guard electrode and the second guard electrode, with at least one notch of said second guard turn which extends between the first guard electrode and the second guard electrode.

16. A system comprising:

a device as claimed in claim 1;

a control circuit, electrically connected to both ends of the coil of said device in order to control the transmission and reception of the radiofrequency signal; and a capacitance-measuring circuit, electrically connected to the first electrode and to the guard turn of said device, the connection to the guard turn being made at a connection point located halfway along the coil, considering the unwound length of said coil.

17. A system comprising:

a device as claimed in claim 2;

a control circuit, electrically connected to both ends of the coil of said device in order to control the transmission and reception of the radiofrequency signal; and a capacitance-measuring circuit, electrically connected to the first electrode and to the guard turn of said device, the connection to the guard turn being made at a connection point located halfway along the coil, considering the unwound length of said coil.

18. A system comprising:

a device as claimed in claim 4;

a control circuit, electrically connected to both ends of the coil of said device in order to control the transmission and reception of the radiofrequency signal; and a capacitance-measuring circuit, electrically connected to the first electrode and to the guard turn of said device, the connection to the guard turn being made at a connection point located halfway along the coil, considering the unwound length of said coil.

* * * * *